United States Patent
Lee et al.

(10) Patent No.: US 11,444,538 B2
(45) Date of Patent: Sep. 13, 2022

(54) SWITCHING REGULATOR BASED ON LOAD ESTIMATION AND OPERATING METHOD THEREOF

(71) Applicant: SAMSUNG ELECTRONICS CO., LTD., Suwon-si (KR)

(72) Inventors: Seunggyu Lee, Hwaseong-si (KR); Seongmun Park, Hwaseong-si (KR); Jaehyuk Yang, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 16/911,763

(22) Filed: Jun. 25, 2020

(65) Prior Publication Data
US 2021/0159796 A1    May 27, 2021

(30) Foreign Application Priority Data
Nov. 27, 2019 (KR) .................. 10-2019-0154348

(51) Int. Cl.
*H02M 3/158*    (2006.01)
*G05F 1/56*     (2006.01)
(Continued)

(52) U.S. Cl.
CPC .... *H02M 3/1584* (2013.01); *G01R 19/16528* (2013.01); *G05F 1/462* (2013.01); *G05F 1/561* (2013.01); *G05F 1/565* (2013.01); *H03K 3/02337* (2013.01); *H03K 5/24* (2013.01); *H02M 1/0009* (2021.05); *H02M 1/0025* (2021.05); *H02M 1/0058* (2021.05)

(58) Field of Classification Search
CPC ............. H02M 3/1584; H02M 1/0009; H02M 1/0025; H02M 1/0058; G05F 1/462; G05F 1/561; G05F 1/565; G01R 19/16528; H03K 3/02337; H03K 5/24
See application file for complete search history.

(56) References Cited

U.S. PATENT DOCUMENTS 8,049,481 B2   11/2011   Li et al.
8,067,929 B2   11/2011   Huang et al.
(Continued)

FOREIGN PATENT DOCUMENTS

KR    10-1271505    5/2013

*Primary Examiner* — Kyle J Moody
*Assistant Examiner* — Lakaisha Jackson
(74) *Attorney, Agent, or Firm* — Volentine, Whitt & Francos, PLLC

(57) ABSTRACT

A switching regulator may be used to generate an output voltage from an input voltage. The switching regulator includes; an inductor including a first terminal and a second terminal that passes an inductor current from the first terminal to the second terminal, a first switch that applies the input voltage to the first terminal when turned ON, a second switch that applies a ground potential to the first terminal when turned ON, a feedback circuit configured to estimate a load receiving the output voltage, detect when the inductor current reaches an upper bound or a lower bound, and adjust the lower bound based on the estimated load, and a switch driver configured to control the first switch and the second switch, such that the inductor current is between the upper bound and the lower bound in response to at least one feedback signal provided by the feedback circuit.

20 Claims, 24 Drawing Sheets

(51) Int. Cl.
  *G05F 1/46* (2006.01)
  *G05F 1/565* (2006.01)
  *H03K 5/24* (2006.01)
  *G01R 19/165* (2006.01)
  *H03K 3/0233* (2006.01)
  *H02M 1/00* (2006.01)

(56) References Cited

U.S. PATENT DOCUMENTS

| | | | |
|---|---|---|---|
| 8,692,535 B1 * | 4/2014 | Sreenivas | H02M 3/156 |
| | | | 323/285 |
| 8,928,299 B2 | 1/2015 | Matzberger et al. | |
| 8,981,737 B2 | 3/2015 | Huang et al. | |
| 10,116,211 B2 | 10/2018 | Chen et al. | |
| 10,715,039 B1 * | 7/2020 | Ilango | G01R 19/175 |
| 2002/0057082 A1 * | 5/2002 | Hwang | H02M 3/158 |
| | | | 323/284 |
| 2009/0121695 A1 * | 5/2009 | Pierson | H02M 3/1584 |
| | | | 323/283 |
| 2011/0291632 A1 | 12/2011 | Yu et al. | |
| 2014/0300329 A1 | 10/2014 | Thompson et al. | |
| 2015/0028830 A1 | 1/2015 | Chen | |

* cited by examiner

SWITCHING REGULATOR BASED ON LOAD ESTIMATION AND OPERATING METHOD THEREOF

CROSS-REFERENCE TO RELATED APPLICATION

This application claims the benefit of Korean Patent Application No. 10-2019-0154348 filed on Nov. 27, 2019 in the Korean Intellectual Property Office, the subject matter of which is hereby incorporated by reference.

BACKGROUND

The inventive concept relates to switching regulators, and more particularly, to switching regulators operating based (or in response to) a load estimation. The inventive concept also relates to operating methods for switching regulators.

Supply voltage(s) may be generated to provide power to electric components, and the power consumed by the electrical components may vary dramatically for a variety of reasons. For example, in order to reduce power consumption in a mobile application, the supply voltage may be reduced or interrupted (or blocked) when one or more electrical components are not in use. Alternately or additionally, one or more electrical components may operate in a mode that reduces power consumption. Switching regulators are commonly used to generate a supply voltage. However, when used, a switching regulator should provide the supply voltage with desirable characteristics in a highly efficient manner, even if power consumption by electrical component(s) receiving the power supply voltage varies over a wide range.

SUMMARY

The inventive concept provides switching regulators that provide voltage(s) exhibiting excellent characteristics, such as low noise, over a wide range of power consumption. The inventive concept also provides an operating method for switching regulators that provide voltage(s) exhibiting excellent characteristics, such as low noise, over a wide range of power consumption.

According to an aspect of the inventive concept, there is provided a switching regulator that generates an output voltage from an input voltage. The switching regulator includes; an inductor including a first terminal and a second terminal that passes an inductor current from the first terminal to the second terminal, a first switch that applies the input voltage to the first terminal when turned ON, a second switch that applies a ground potential to the first terminal when turned ON, a load estimator that estimates a load receiving the output voltage and provides load information corresponding to the load, a first current detector that detects that when the inductor current reaches a lower bound and generates a first detection signal wherein the lower bound being adjusted based on the load information, and a switch driver configured to turn OFF the second switch in response to the first detection signal when the inductor current reaches the lower bound.

According to an aspect of the inventive concept, there is provided a switching regulator that generates an output voltage from an input voltage. The switching regulator includes; an inductor including a first terminal and a second terminal that passes an inductor current from the first terminal to the second terminal, a first switch that applies the input voltage to the first terminal when turned ON, a second switch that applies a ground potential to the first terminal when turned ON, a feedback circuit configured to estimate a load receiving the output voltage, detect when the inductor current reaches an upper bound or a lower bound, and adjust the lower bound based on the estimated load, and a switch driver configured to control the first switch and the second switch, such that the inductor current is between the upper bound and the lower bound in response to at least one feedback signal provided by the feedback circuit.

According to an aspect of the inventive concept, there is provided a method of converting an input voltage to an output voltage. The method includes; detecting that an inductor current passing from a first terminal of an inductor to a second terminal of the inductor reaches an upper bound or a lower bound and generating a detection result, controlling a voltage apparent at the first terminal in response to the detection result by at least one of: applying the input voltage to the first terminal; applying a ground potential to the first terminal, and allowing the first terminal to float, estimating a load in response to the inductor current, and adjusting the lower bound based on the estimated load.

According to an aspect of the inventive concept, there is provided a switching regulator including; a switch driver that generates a push signal and a pull signal, wherein the push signal controls a first switch that selectively applies an input voltage to a switch node, and the pull signal controls a second switch that selectively applies a ground potential to the switch node, an inductor that passes an inductor current from the switch node to an output terminal at which an output voltage is apparent, wherein the inductor current has a lower bound and an upper bound, a load estimator that estimates a load receiving the output voltage in response to at least one of the lower bound and the upper bound, and provides load information corresponding to the load, a first current detector that detects when the inductor current reaches the lower bound and generates a first detection signal in response to the load information, a second current detector that detects when the inductor current reaches the upper bound and generates a second detection signal, and a comparator that compares a reference voltage to a feedback voltage generated from the output voltage and generates a comparison signal, wherein the switch driver generates the push signal and the pull signal in response to the first detection signal, the second detection signal and the comparison signal.

BRIEF DESCRIPTION OF THE DRAWINGS

Embodiments of the inventive concept may be more clearly understood upon consideration of the following detailed description taken in conjunction with the accompanying drawings in which.

DETAILED DESCRIPTION

Figure 1:
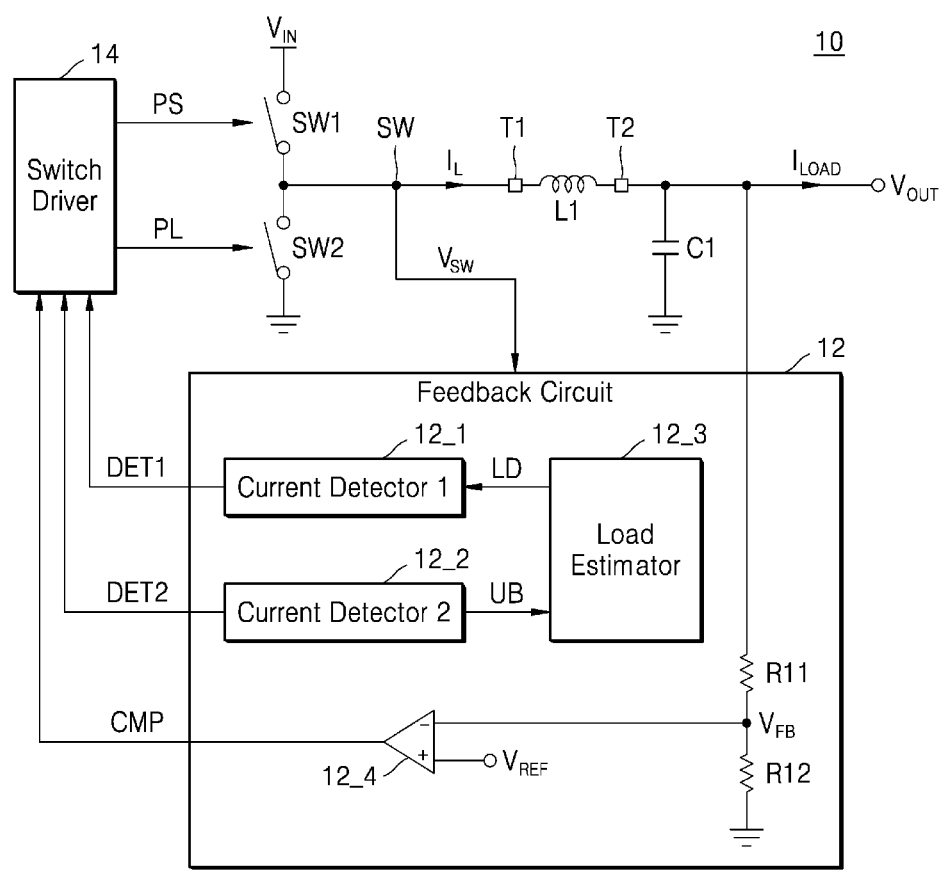
FIG. 1 is a block diagram illustrating an example of a switching regulator according to an embodiment.

Figure (FIG. 1 is a block diagram illustrating a switching regulator 10 according to embodiments of the inventive concept. The switching regulator 10 may be used to generate an output voltage $V_{OUT}$ from an applied input voltage $V_{IN}$. The output voltage $V_{OUT}$ may be provided (e.g., as the supply voltage) to one or more electrical components hereafter referred to as the "load." Referring to FIG. 1, the switching regulator 10 may include an inductor L1, a capacitor C1, a first switch SW1, a second switch SW2, a feedback circuit 12, and a switch driver 14. In some embodiments, elements of the switching regulator 10 may be included in a single semiconductor package. In some embodiments, the switching regulator 10 may include a printed circuit board (PCB), mounting two or more elements of the switching regulator 10 including two or more semiconductor packages.

In general application, the switching regulator 10 provides the output voltage $V_{OUT}$ by switching a device ON and/or OFF (hereafter, ON/OFF). For example, the first switch SW1 and the second switch SW2 of the switching regulator 10 may be turned ON/OFF in response to a push signal PS and a pull signal PL provided from the switch driver 14. Here, the term "ON" denotes a switch condition wherein the ends of the switch are electrically connected. The term "OPP" denotes a switch condition wherein the ends of the switch are electrically disconnected.

Two or more components that are electrically connected when a switch is turned ON are deemed to be "connected." Two or more components that are electrically disconnected when a switch is turned OFF are deemed to be "disconnected." Two or more components always electrically connected (e.g., via a conducting wire, etc.) are deemed to be "coupled."

In some embodiments, the first switch SW1 may include a P-type field effect transistor (PFET) as a power transistor that is turned ON in response to a low level (hereafter, "low") push signal PS. In some embodiments, the second switch SW2 may include an N-type field effect transistor (NFET) as a power transistor that is turned ON in response to a high level (hereafter, "high") pull signal PL. Thus, in the description that follows, the push signal PS is assumed to be an active-low signal and the pull signal PL is assumed to be an active-high signal, but it will be understood that this is merely a current working assumption.

In certain embodiments when both the input voltage $V_{IN}$ and the output voltage $V_{OUT}$ are positive direct current (DC) voltages, and switching regulator 10 may be referred to as a DC-DC converter. For example, the switching regulator 10 may be a so-called buck converter that generates the output voltage $V_{OUT}$ at a level less than the level of the input voltage $V_{IN}$. Under these conditions, the switching regulator 10 may be referred to as a step-down converter. Alternately, the switching regulator 10 may be a boost converter that generates the output voltage $V_{OUT}$ at a level higher than the level of the input voltage $V_{IN}$. Under these conditions, the switching regulator 10 may be referred to as a step-up converter. Alternately, the switching regulator 10 may be a buck-boost (or step-up) converter and may generate the output voltage $V_{OUT}$ having a level lower or higher than the level of the input voltage $V_{IN}$. Hereinafter, the switching regulator 10 will be described largely in the context of a buck converter, but it will be understood that the principles and features taught in relation to the illustrated embodiments may be applied to other types of DC-DC converters, as well as to AC-DC converters in which the input voltage $V_{IN}$ is an alternating current (AC) voltage.

In some embodiments, the switching regulator 10 may support a pulse frequency modulation (PFM) mode of operation and a pulse width modulation (PWM) mode of operation that may be used in relation to a widely variable load current $I_{LOAD}$ associated with the load receiving the output voltage $V_{OUT}$. For example, the switching regulator 10 may operate in the PFM mode when the load current $I_{LOAD}$ is relatively low and in the PWM mode when the load current $I_{LOAD}$ is relatively high. The PFM mode provides relatively higher efficiency at a low load current $I_{LOAD}$, but increasingly lower efficiency as the load current $I_{LOAD}$ increases above a certain magnitude. Raising the allowable peak level of an inductor current $I_L$ improves efficiency in the PFM mode, but also increases noise on output voltage $V_{OUT}$ (e.g., ripple). At certain levels nose may cause malfunction of the load.

The switching regulator 10 of FIG. 1, like other switching regulators according to embodiments of the inventive concept, may maintain or increase efficiency in the PFM mode without increasing the allowable peak level of the inductor current $I_L$ when the load current $I_{LOAD}$ increases. Accordingly, the output voltage $V_{OUT}$ may be generated with improved efficiency and better noise characteristics.

In the description that follows, a load in a state that consumes a relatively low load current $I_{LOAD}$ (e.g., a state consuming relatively low power) will be referred to as a "small load," and a load in a state that consumes a relatively high load current $I_{LOAD}$ (e.g., a state consuming relatively high power) will be referred to as a "large load."

The first switch SW1 may be turned ON in response to an activated (e.g., low) push signal PS, such that the input voltage $V_{IN}$ is applied to a first terminal T1 of an inductor L1 and a switch node SW. The second switch SW2 may be turned ON in response to an activated (e.g., high) pull signal PL, such that the input voltage $V_{IN}$ is applied to the switch node SW. When the first switch SW1 and the second switch SW2 are both turned OFF, the switch node SW electrically floats. Accordingly, the various applications of voltage to the first terminal T1 of the inductor L1 (i.e., the voltage $V_{SW}$ apparent at the switch node SW—hereafter "the switch node voltage $V_{SW}$") may be switch-controlled, and the inductor current $I_L$ passing through the inductor L1 from the first terminal T1 of the inductor L1 to the second terminal T2 of the inductor L1 may be controlled. In this regard, the inductor current $I_L$ may increase when the first switch SW1 is turned ON and decrease when the second switch SW2 is turned ON. And when both the first switch SW1 and the second switch SW2 are turned OFF, the inductor current $I_L$ will be about zero. As shown in FIG. 1, a capacitor C1 may be coupled to the second terminal T2 of the inductor L1. Thus, the output voltage $V_{OUT}$ may be generated across the second terminal T2 of the inductor L1 (and an output terminal for the switching regulator 10), and the load current $I_{LOAD}$ may be provided to the load receiving the output voltage $V_{OUT}$. In some embodiments, the first switch SW1 and the second switch SW2 may be referred to respectively as a high side switch and a low side switch.

The feedback circuit 12 may be used to generate various signals applied to the switch driver 14 in response to the state of the switching regulator 10. For example, the feedback circuit 12 may generate a first detection signal DET1, a second detection signal DET2, and a comparison signal CMP in response to the output voltage $V_{OUT}$, the switch node voltage $V_{SW}$, etc.

As shown in FIG. 1, the feedback circuit 12 may include a first current detector 12_1, a second current detector 12_2, and a load estimator 12_3, as well as a first resistor R11, a second resistor R12, and a comparator 12_4.

The first current detector 12_1 may be used to detect a condition when the inductor current $I_L$ reaches a lower bound. For example, the first current detector 12_1 may generate an activated first detection signal DET1 when the inductor current $I_L$ is less than or equal to the lower bound. In some embodiments, the first current detector 12_1 may detect that the inductor current $I_L$ reaches the lower bound in response to a ground potential and the switching node voltage $V_{SW}$. In some embodiments, the lower bound of the inductor current $I_L$ may be set to zero, and the first current detector 12_1 may be referred to as a zero current detector or zero current sensor.

In some embodiments, the first current detector 12_1 may be used to adjust the lower bound in response to load information LD provided by the load estimator 12_3. As will be described hereafter, the load information LD indicate (e.g.,) a magnitude of the load receiving the output voltage $V_{OUT}$ (e.g., a magnitude of the load current $I_{LOAD}$, a magnitude of power consumed by the load, etc.). The first current detector 12_1 may obtain the load information LD as a voltage and/or a current having magnitude(s) corresponding to the load information LD provided by the load estimator 12_3.

The first current detector 12_1 may be used to increase an upper bound of the inductor current $I_L$ as the load increases in response to the load information LD. Accordingly, as the load increases, the inductor current $I_L$ may reach the lower bound early, and the switch driver 14 may turn ON the first switch SW1 early using the activated push signal PS in response to the first detection signal DET1. Further, in some embodiments (e.g., the example described hereafter with reference to FIG. 12), the first current detector 12_1 may adjust the lower bound of the inductor current $I_L$ in response to a comparison signal CMP generated by the comparator 12_4 in addition to the load information LD. Examples of the first current detector 12_1 will be described hereafter with reference to at least FIGS. 9 and 12. Hereafter, the upper bound and the lower bound of the inductor current IL may be referred to simply as the upper bound and the lower bound.

The second current detector 12_2 may be used to detect a condition in which the inductor current $I_L$ reaches the upper bound. For example, the second current detector 12_2 may generate an activated second detection signal DET2 when the inductor current $I_L$ is greater than or equal to the upper bound. In some embodiments, the second current detector 12_2 may detect that the inductor current $I_L$ reaches the upper bound in response to the push signal PS and the switch node voltage $V_{SW}$. In some embodiments, the upper bound of inductor current $I_L$ may be referred to as the allowable peak level or peak current of inductor current $I_L$, and the second current detector 12_2 may be referred to as a peak current detector or a peak current sensor. In some embodiments, the upper bound of inductor current $I_L$ used by the second current detector 12_2 may be predetermined. As shown in FIG. 1, the second current detector 12_2 may provide upper bound information UB to the load estimator 12_3. For example, the second current detector 12_2 may provide the load estimator 12_3 with a voltage and/or a current having the magnitude corresponding to the upper bound information UB. An example of the second current detector 12_2 will be described in some additional detail hereafter with reference to FIG. 2.

The load estimator 12_3 may estimate the load (or the magnitude of the load) that receives the output voltage $V_{OUT}$ and consumes the load current $I_{LOAD}$. For example, the load estimator 12_3 may obtain the upper bound information UB from the second current detector 12_2, and generate the load information LD in response to the upper bound information UB and the switch node voltage $V_{SW}$. In some embodiments, the load estimator 12_3 may generate the load information LD in relation to a period during which the inductor current $I_L$ is greater than or equal to the lower bound. As described above, the load information LD may be used to adjust the lower bound of the inductor current $I_L$ used by the first current detector 12_1, and the load estimator 12_3 may estimate the magnitude of the load simply and accurately to generate the load information LD. Examples of the load estimator 12_3 will be described in some additional detail hereafter with reference to at least FIGS. 4 and 7.

The comparator 12_4 may be used to generate the comparison signal CMP in response to a feedback voltage $V_{FB}$ and a reference voltage $V_{REF}$. As shown in FIG. 1, the feedback voltage $V_{FB}$ may be generated by dividing the output voltage $V_{OUT}$ across the first resistor R11 and the second resistor R12. The reference voltage $V_{REF}$ may have the magnitude obtained by dividing a target magnitude of the output voltage $V_{OUT}$. As illustrated in FIG. 1, the comparator 12_4 may generate an activated comparison signal CMP when the feedback voltage $V_{FB}$ is less than or equal to the reference voltage $V_{REF}$. In some embodiments, the comparator 12_4 may generate the activated comparison signal CMP when the feedback voltage $V_{FB}$ is greater than or equal to the reference voltage $V_{REF}$, as shown in FIG. 1.

The switch driver 14 may be used to generate the push signal PS and the pull signal PL in response to signals provided from the feedback circuit 12 (e.g., the first detection signal DET1, the second detection signal DET2, and the comparison signal CMP). In some embodiments, the switch driver 14 may include logic gates that perform one or more logical operation(s) on the first detection signal DET1, the second detection signal DET2, and the comparison signal CMP in order to generate the push signal PS and the pull signal PL. In some embodiments, the switch driver 14 may generate the push signal PS and the pull signal PL such that the output voltage $V_{OUT}$ is substantially maintained at a desired voltage level in response to the first detection signal DET1, the second detection signal DET2, and the comparison signal CMP. In addition, in some embodiments, the switch driver 14 may generate the push signal PS and the pull signal PL such that the inductor current $I_L$ is substantially maintained between the upper bound and the lower bound. Examples of the operation of the switch driver 14 will be described in some additional detail with reference to at least FIGS. 18A, 18B, 18C and 18D (hereafter, 18A to 18D).

Figure 2:
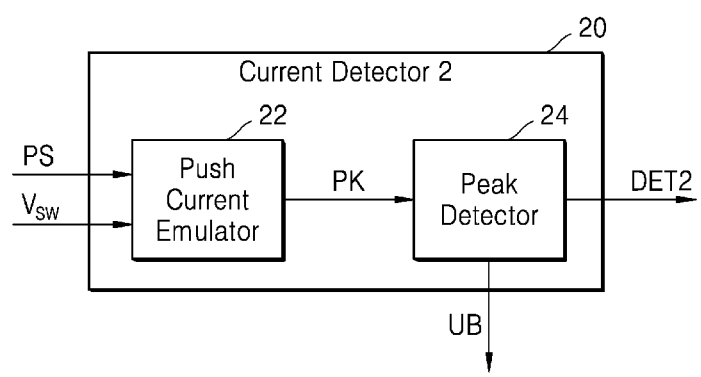
FIG. 2 is a block diagram illustrating an example of a second current detector according to an embodiment.
Figure 3:
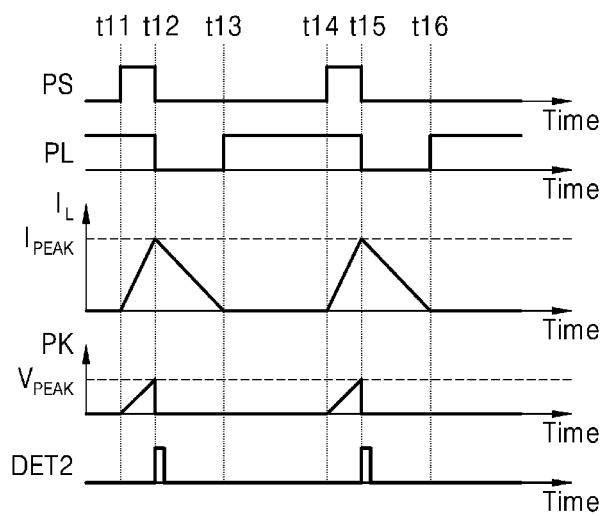
FIG. 3 is a timing diagram illustrating an example of an operation of a second current detector according to an embodiment.

FIG. 2 is a block diagram further illustrating one example of the second current detector of FIG. 1 according to an embodiment, and FIG. 3 is a timing diagram illustrating one possible operation of the second current detector of FIG. 2. Consistent with the description related to FIG. 1, a second current detector 20 of FIG. 2 may be used to detect a condition in which the inductor current $I_L$ reaches an upper bound.

Referring to FIG. 2, the second current detector 20 may include a push current simulator 22 and a peak detector 24 and may be used to generate the second detection signal DET2 and the upper bound information UB. The push current simulator 22 receives the push signal PS and the switch node voltage Vsw, and generates a peak signal PK that simulates the inductor current $I_L$ (e.g., a current flowing through the first switch SW1 to the inductor L1) in response to the push signal PS and the switch node voltage Vsw. For example, the push current simulator 22 may generate a current having a magnitude smaller than that of the current passing through the first switch SW1 and simulating the current passing through the first switch SW1 and generate the peak signal PK as a voltage signal from the generated current.

The peak detector 24 may be used to detect a condition in which the inductor current $I_L$ reaches the upper bound in response to the peak signal PK, and generate the activated second detection signal DET2 when the inductor current $I_L$ reaches the upper bound. In some embodiments, the peak detector 24 may generate the activated second detection signal DET2 for a preset period of time. In addition, the peak detector 24 may generate the upper bound information UB (e.g., a voltage and/or a current having a magnitude corresponding to the upper bound information UB).

Referring to FIGS. 1, 2 and 3, at each of time t11 and time t14, the switch driver 14 may generate the activated push signal PS in response to the comparison signal CMP generated by the comparator 12_4. Accordingly, the first switch SW1 may be turned ON, and the input voltage $V_{IN}$ may be applied to the switch node SW by the first switch SW1. The inductor current $I_L$ may start to increase, and the peak signal PK may also increase.

At each of time t12 and time t15, the inductor current $I_L$ may reach an upper bound (i.e., a peak current $I_{PEAK}$), and the peak detector 24 may generate the activated second detection signal DET2. For example, the peak detector 24 may detect that the peak signal PK as a voltage signal that reaches a peak voltage $V_{PEAK}$ corresponding to the peak current $I_{PEAK}$. The switch driver 14 may generate the deactivated push signal PS and the activated pull signal PL in response to the activated second detection signal DET2. Accordingly, due to the OFF first switch SW1 and the ON second switch SW2, the inductor current $I_L$ may gradually decrease.

At each of time t13 and time t16, the inductor current $I_L$ may be approximately zero, and the switch driver 14 may generate the deactivated pull signal PL in response to the second detection signal DET2 generated by the first current detector 12_1. Accordingly, the second switch SW2 may be turned OFF and the inductor current $I_L$ may be approximately maintained at zero. Depending on the state of the load (i.e., the load current $I_{LOAD}$ required by the load), the duration of each of periods may vary between the times t11 to t16.

Figure 4:
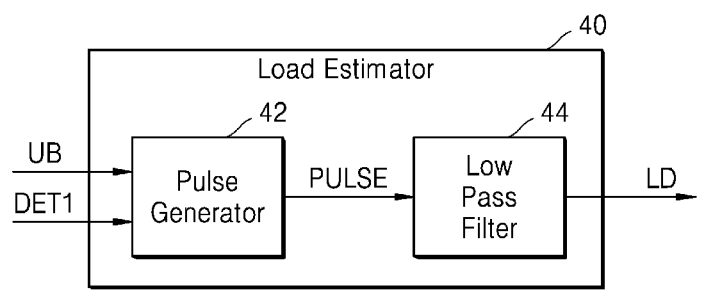
FIG. 4 is a block diagram illustrating an example of a load estimator according to an embodiment.

FIG. 4 is a block diagram further illustrating in one example (40) the load estimator of FIG. 1. Consistent with the description of FIG. 1, the load estimator 40 of FIG. 4 including a pulse generator 42 and a low pass filter 44 may be used to generate the load information LD by estimating the magnitude of the load. Here, the pulse generator 42 that receives the upper bound information UB and the first detection signal DET1, and generate a pulse signal PULSE having a magnitude proportional to an upper bound during a period in which the inductor current $I_L$ is greater than or equal to a lower bound. That is, the pulse generator 42 may receive the upper bound information UB and the first detection signal DET1 and generate the pulse signal PULSE.

Referring to FIGS. 1, 3 and 4, the pulse generator 42 may recognize period(s) (e.g., the period between time t11 and time t13, and the period between time t14 and time t16) during which the inductor current $I_L$ is greater than or equal to the lower bound in response to the first detection signal DET1 generated by the first current detector 12_1, and obtain the upper bound of the inductor current $I_L$ in response to the upper bound information UB. Accordingly, the pulse generator 42 may generate the pulse signal PULSE having a magnitude proportional to the upper bound while the first detection signal DET1 is deactivated, and the pulse area of the pulse signal PULSE may be proportional to the electrical charge provided to the load by the inductor current $I_L$. In some embodiments, the switch driver 14 may generate a signal activated while the push signal PS and/or the pull signal PL are activated (e.g., between time t11 and time t13, and between time t14 and time t16). Alternately, the pulse generator 42 may generate the pulse signal PULSE having a magnitude in proportion to the upper bound while the signal generated by the switch driver 14 is activated, instead of the first detection signal DET1.

The low pass filter 44 may receive the pulse signal PULSE and generate the load information LD by filtering the pulse signal PULSE. Accordingly, the load information LD may have a magnitude proportional to the pulse area of the pulse signal PULSE. Examples of the pulse generator 42 and the low pass filter 44 will be described in some additional detail with reference to at least FIGS. 5 and 6.

Figure 5:
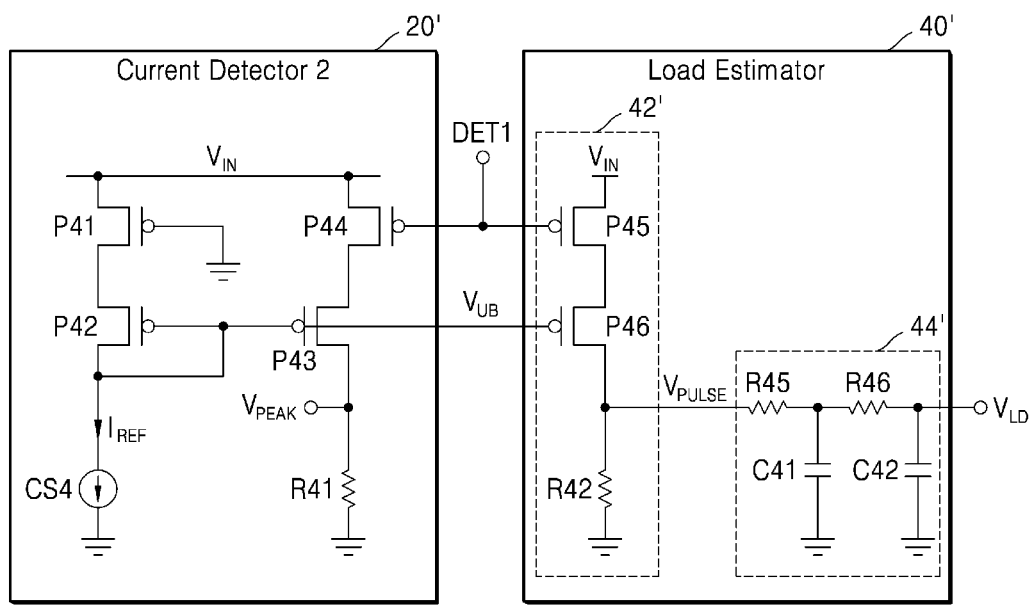
FIG. 5 is a circuit diagram illustrating an example of a load estimator according to an embodiment.
Figure 6:
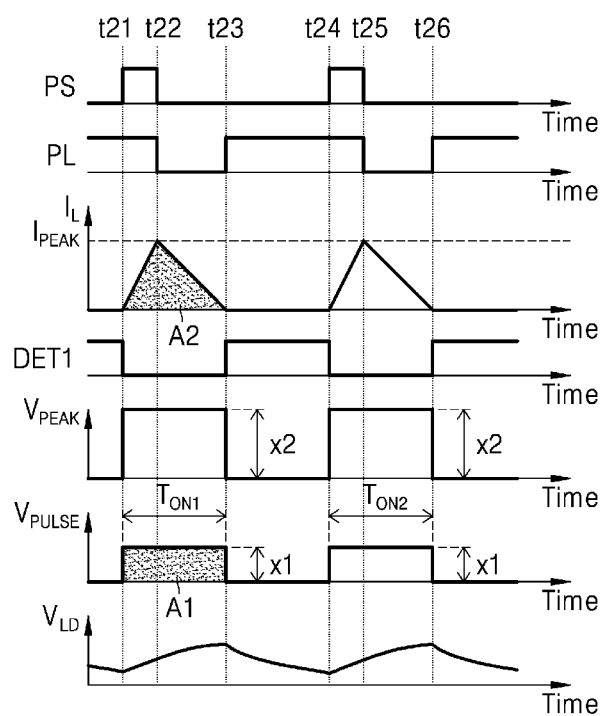
FIG. 6 is a timing diagram illustrating an example of an operation of a load estimator according to an embodiment.

FIG. 5 is a circuit diagram illustrating another example of a load estimator 40' according to embodiments, and FIG. 6 is a timing diagram illustrating a possible operation of the load estimator 40' of FIG. 5.

In this regard, FIG. 5 illustrates part of a second current detector 20' in conjunction with the load estimator 40'. Hereinafter, FIGS. 5 and 6 will be described with reference to FIG. 1, and certain description of FIG. 6 redundant with that of FIG. 3 will be omitted.

Referring to FIG. 5, the second current detector 20' may include first to fourth PFETs P41 to P44, a first resistor R41, and a current source CS4. The current source CS4 may draw the reference current $I_{REF}$ from the second PFET P42, and the second PFET P42 and the third PFET P43 may form a current mirror. The fourth PFET P44 may have a source to which the input voltage $V_{IN}$ is applied and a gate to receive the first detection signal DET1, and thus may be turned ON in response to the deactivated (e.g., low) first detection signal DET1. The first PFET P41 may have a gate coupled to a ground potential as a replication transistor of the fourth PFET P44, and may have the same size as the fourth PFET P44. Accordingly, a current proportional to the reference current $I_{REF}$ may pass through the first resistor R41 during a period in which the first detection signal DET1 is deactivated (i.e., a period in which the inductor current $I_L$ is greater than or equal to the lower bound), and the peak voltage $V_{PEAK}$ is apparent at a node to which the third PFET P43 and the first resistor R41 are coupled. The peak voltage $V_{PEAK}$ may be compared with the peak signal PK, as described above with reference to FIG. 3, and may be used to detect a condition in which the inductor current $I_L$ reaches the peak current $I_{PEAK}$ (i.e., the upper bound). The magnitude of the reference current $I_{REF}$, the ratio of the magnitude (or current driving capability) between the second PFET P42 and the third PFET P43, and the resistance of the first resistor R41 may be determined in response to the peak current $I_{PEAK}$ and a ratio between the inductor current $I_L$ and the peak signal PK.

The second current detector 20' may provide the load estimator 40' with upper bound information voltage $V_{UB}$ indicating the upper bound information UB. As shown in FIG. 5, the upper bound information voltage $V_{UB}$ may be a voltage apparent at gates of the second PFET P42 and the third PFET P43 and may be inversely proportional to the upper bound (e.g., the peak voltage $V_{PEAK}$ or the peak current $I_{PEAK}$). In addition to the circuit shown in FIG. 5, the second current detector 20' may further include an additional circuit for generating the second detection signal DET2 described with reference to FIG. 2.

The load estimator 40' may include a pulse generator 42' and a low pass filter 44', as described above with reference to FIG. 4, and may generate the load information voltage $V_{LD}$ as the load information LD. The pulse generator 42' may include a fifth PFET P45, a sixth PFET P46, and a second resistor R42 connected in series between the input voltage $V_{IN}$ and the ground potential, receive the first detection signal DET1 and the upper bound information voltage $V_{UB}$, and generate the pulse voltage $V_{PULSE}$ as the pulse signal PULSE. The fifth PFET P45 may have the same size as the fourth PFET P44 and may be turned ON in response to the deactivated first detection signal DET1. Accordingly, a current proportional to the reference current $I_{REF}$ may pass through the second resistor R42 during the period in which the first detection signal DET1 is deactivated (e.g., a period during which the inductor current $I_L$ is greater than or equal to the lower bound), and the pulse voltage $V_{PULSE}$ proportional to the peak voltage $V_{PEAK}$ may be apparent at a node to which the sixth PFET P46 and the second resistor R42 are coupled. In some embodiments, as described below with reference to FIG. 6, while the first detection signal DET1 is deactivated, the pulse voltage $V_{PULSE}$ may be half of the peak voltage $V_{PEAK}$. To this end, in some embodiments, the third PFET P43 and the sixth PFET P46 may have the same size, and the resistance of the second resistor R42 may be half of the resistance of the first resistor R41. Also, in some embodiments, the first resistor R41 and the second resistor R42 may have the same resistance value, and the size of the sixth PFET P46 may be half the size of the third PFET P43.

The low pass filter 44' may include a fifth resistor R45, a sixth resistor R46, a first capacitor C41, and a second capacitor C42, and may be used to generate the load information voltage $V_{LD}$ by filtering the pulse voltage $V_{PULSE}$. Resistance values of the fifth resistor R45 and the sixth resistor R46 and the capacitances of the first capacitor C41 and the second capacitor C42 may be determined in response to a desired cutoff frequency for the low pass filter 44'. Here, it should be noted that the structure of the low pass filter 44 of FIG. 4 is not limited to only the low pass filter 44' of FIG. 5.

Referring to FIG. 6, at each of time t21 and time t24, the push signal PS may be activated and the inductor current $I_L$ may start to increase. Accordingly, the first detection signal DET1 may be deactivated, and the peak voltage $V_{PEAK}$ and the pulse voltage $V_{PULSE}$ may increase. For example, as shown in FIG. 6, a magnitude x1 of the pulse voltage $V_{PULSE}$ may be half that of a magnitude x2 of the peak voltage $V_{PEAK}$ at time t21. Also, due to the increase in the pulse voltage $V_{PULSE}$, the load information voltage $V_{LD}$ may also gradually increase. Then, at each of time t22 and time t25, the push signal PS may be deactivated and the pull signal PL may be activated. As a result, the inductor current $I_L$ may start to gradually decrease.

At each of time t23 and time t26, the pull signal PL may be deactivated and the inductor current $I_L$ may be approximately zero. Accordingly, the first detection signal DET1 may be activated, and the peak voltage $V_{PEAK}$ and the pulse voltage $V_{PULSE}$ may decrease. Accordingly, the pulse voltage $V_{PULSE}$ may have a positive value while the first detection signal DET1 is deactivated, that is, during a period $T_{on}$. As a result, an area A1 of the pulse voltage VPULSE during the period $T_{on}$ may be proportional to an area A2 of the inductor current $I_L$, and may correspond to the amount of charge supplied to the load by the inductor current $I_L$. Also, due to the decrease of the pulse voltage $V_{PULSE}$, the load information voltage $V_{LD}$ may also gradually start to decrease. The period $T_{ON1}$ from time t21 to time t23 and a period $T_{ON2}$ from time t24 to time t26 may have the same (or different) durations depending on the state of the load (i.e., the load current $I_{LOAD}$).

Figure 7:
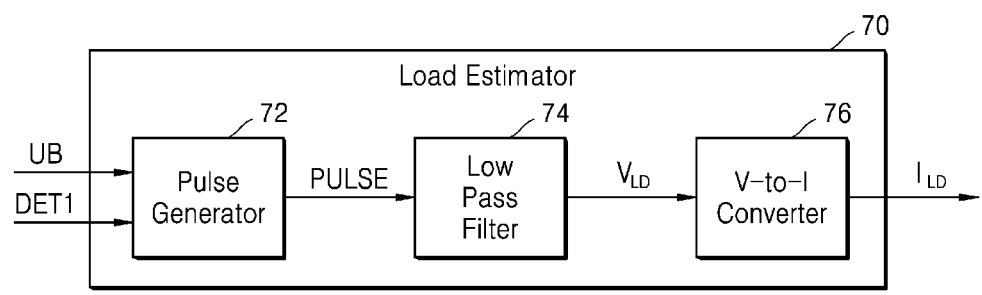
FIG. 7 is a block diagram illustrating an example of a load estimator according to an embodiment.

FIG. 7 is a block diagram illustrating another example of a load estimator 70 according to an embodiment. The load estimator 70 of FIG. 7 may include a pulse generator 72 and a low pass filter 74, similar to the load estimator 40 of FIG. 4, and further include a voltage-to-current converter 76. Hereinafter, FIG. 7 will be described with reference to FIG. 1, and description of FIG. 7 redundant to the descriptions of FIGS. 4, 5 and 6 will be omitted.

The pulse generator 72 may generate the pulse signal PULSE in response to the upper bound information UB and the first detection signal DET1, and the low pass filter 74 may generate the load information voltage $V_{LD}$ by filtering the pulse signal PULSE. The voltage-to-current converter 76 may receive the load information voltage $V_{LD}$ and generate the load information current $I_{LD}$. In some embodiments, the first current detector 12_1 of FIG. 1 may require a current signal the magnitude of which varies according to the load information LD to adjust the lower bound of the inductor current $I_L$ in response to the load information LD. Accordingly, the load estimator 70 may include the voltage-to-current converter 76 that generates the load information current $I_{LD}$ having the magnitude corresponding to the magnitude of the load information voltage $V_{LD}$. The voltage-to-current converter 76 may have any structure for converting a voltage signal into a current signal, and an example of the voltage-to-current converter 76 will be described below with reference to FIG. 8.

Figure 8:
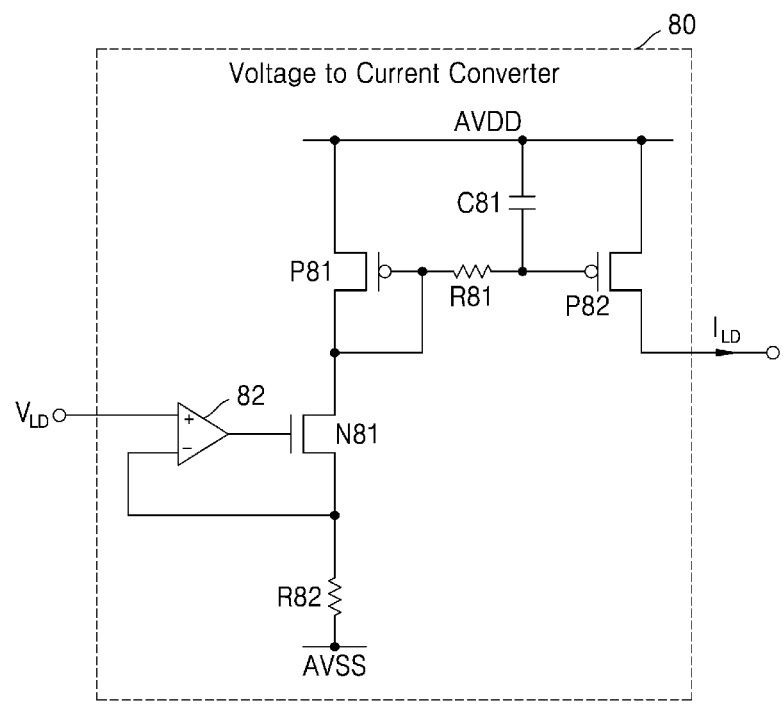
FIG. 8 is a circuit diagram illustrating an example of a voltage-current converter according to an embodiment.

FIG. 8 is a circuit diagram illustrating an example of a voltage-current converter 80 according to an embodiment. As described above with reference to FIG. 7, the voltage-current converter 80 of FIG. 8 may convert the load information voltage $V_{LD}$ into the load information current $I_{LD}$. As shown in FIG. 8, the voltage-to-current converter 80 may include a differential amplifier 82, a first NFET N81, a first PFET P81, a second PFET P82, a first resistor R81, a second resistor R82, and a capacitor C81.

The differential amplifier 82, the first NFET N81, and the second resistor R82 may generate a current depending on the load information voltage $V_{LD}$, and may draw current from the first PFET P81. For example, when the resistance of the second resistor R82, the differential amplifier 82, the first NFET N81, and the second resistor R82 have a current having the magnitude of "$V_{LD}/R82$". The first PFET P81 and the second PFET P82 may form a current mirror and generate the load information current $I_{LD}$ proportional to the current generated by the differential amplifier 82, the first NFET N81, and the second resistor R82. The first resistor R81 and the capacitor C81 may form a low pass filter, and may remove noise affecting the load information current $I_{LD}$. For example, the first resistor R81 and the capacitor C81 may remove high frequency noise and may have a resistance and capacitance respectively for blocking higher frequencies than the blocking frequency of the low pass filter 74 of FIG. 7. In some embodiments, the first resistor R81 and the capacitor C81 may be omitted. A positive supply voltage AVDD and a negative supply voltage AVSS respectively supplying power to the voltage-current converter 80 may be voltages generated like the input voltage $V_{IN}$ of FIG. 1.

Figure 9:
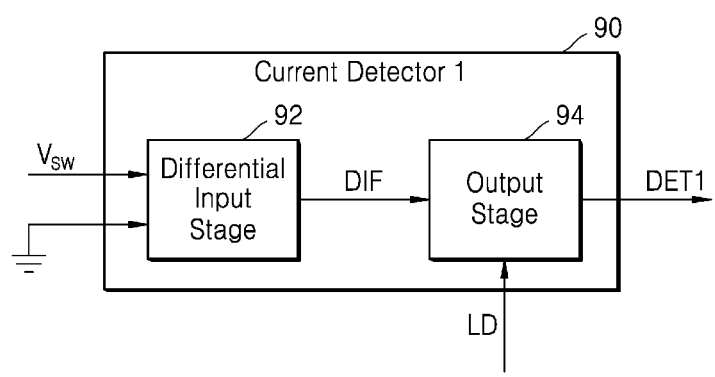
FIGS. 9 and 10 are respective block diagrams illustrating an example of a first current detector according to an embodiment.

FIG. 9 is a block diagram illustrating an example of a first current detector 90 according to an embodiment. Consistent with the description of FIG. 1, the first current detector 90 of FIG. 9 may generate the first detection signal DET1 by detecting a condition at which the inductor current $I_L$ reaches the lower bound. As shown in FIG. 9, the first current detector 90 may include a differential input stage 92 and an output stage 94, and FIG. 9 will be described with reference to FIGS. 1 and 3.

The differential input stage 92 may generate a difference signal DIF by amplifying a difference between the switch node voltage Vsw and the ground potential. For example, while the inductor current $I_L$ gradually decreases from time t12 to time t13 of FIG. 3, the inductor current $I_L$ may be supplied from the ground potential by the second switch SW2 in the ON-state. Accordingly, due to a diode formed by the second switch SW2, the switch node voltage Vsw may be less (or lower) than the ground potential. At time t13, when the inductor current $I_L$ is approximately zero, the voltage drop across the second switch SW2 may be eliminated and the difference signal DIF of the differential input stage 92 may change. In response to the changed difference signal DIF, the first detection signal DET1 may be activated, and the pull signal PL may be deactivated due to the activated first detection signal DET1, and thus the switch node voltage Vsw may be approximately identical to the output voltage $V_{OUT}$. The differential input stage 92 may have any structure that amplifies the difference between the switch node voltage Vsw and the ground potential, and an example of the differential input stage 92 will be described with reference to FIG. 10.

The output stage 94 may receive the difference signal DIF from the differential input stage 92, and generate the first detection signal DET1 by amplifying the difference signal DIF. In addition, the output stage 94 may further receive the load information LD and may generate the first detection signal DET1 further in response to the load information LD. Accordingly, the lower bound of the inductor current $I_L$, which is a reference by which the first detection signal DET1 is activated, may be adjusted according to the load information LD, and when the load current $I_{LOAD}$ increases, the first detection signal DET1 may be activated early due to the lower bound increased by the load information LD.

Figure 10:
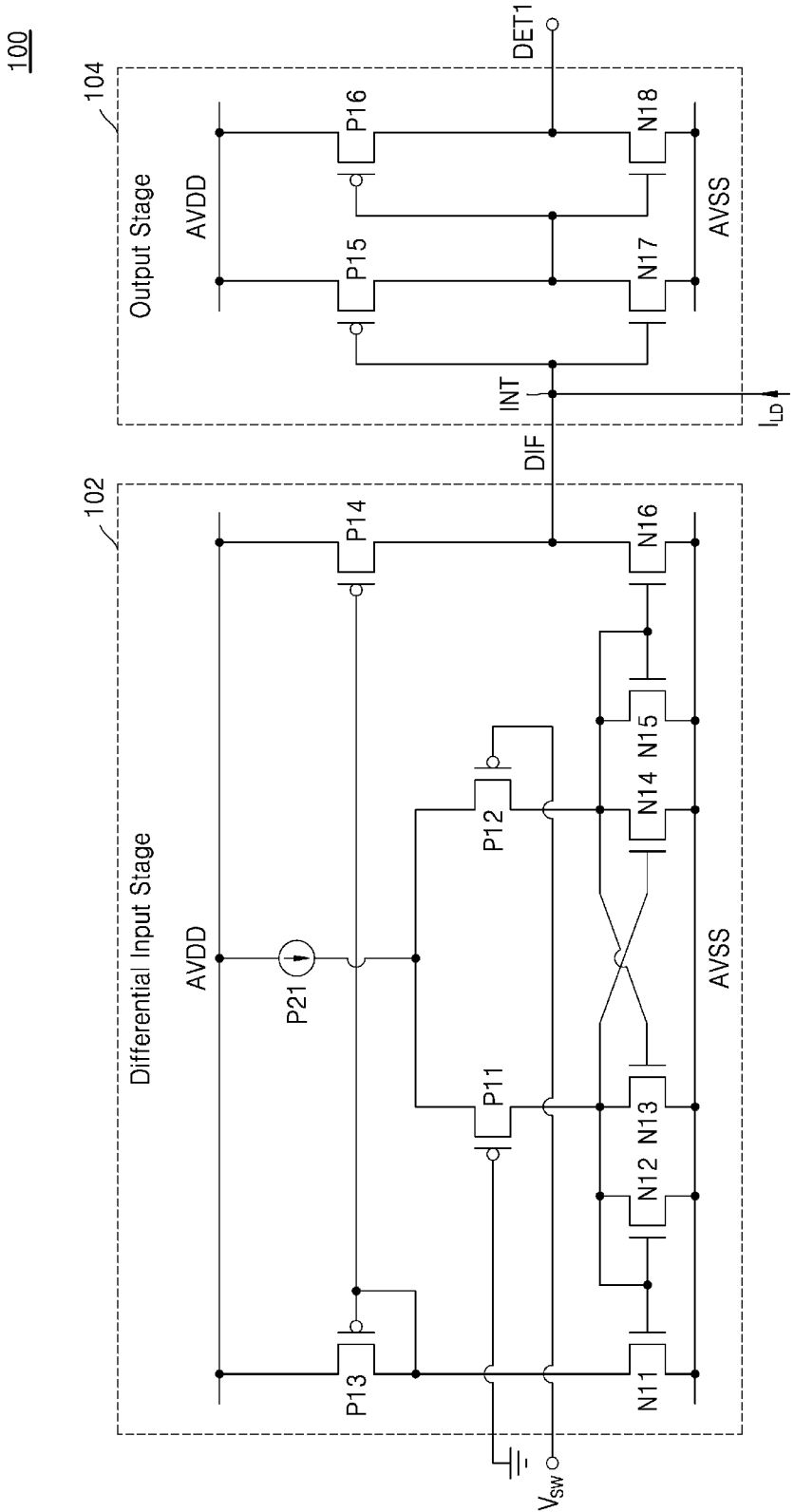
Figure 11:
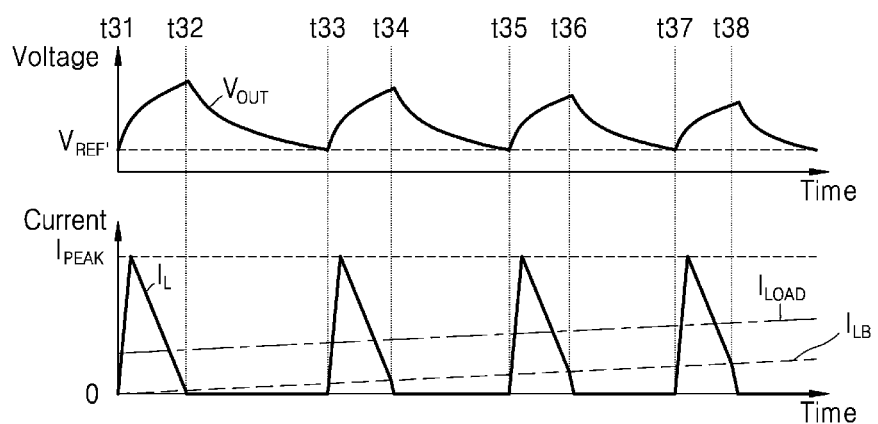
FIG. 11 is a timing diagram illustrating an example of an operation of a first current detector according to an embodiment.

FIG. 10 is a circuit diagram illustrating an example of a first current detector 100 according to an embodiment, and FIG. 11 is a timing diagram illustrating an example of an operation of the first current detector 100 according to an embodiment. Specifically, the circuit of FIG. 10 shows the first current detector 100 that receives the load information current $I_{LD}$ as the load information LD, and the timing diagram of FIG. 11 shows the operation of the first current detector 100 in a situation in which the load current $I_{LOAD}$ increases over time. Hereinafter, FIGS. 10 and 11 will be described with reference to FIG. 1.

Referring to FIG. 10, the first current detector 100 may include a differential input stage 102 and an output stage 104. The differential input stage 102 may include first to sixth NFETs N11 to N16, first to fourth PFETs P11 to P14, and a current source P21. As illustrated in FIG. 10, the differential input stage 102 may generate the difference signal DIF having a voltage that increases as the switch node voltage Vsw is greater than the ground potential. The output stage 104 may include a seventh NFET N17, an eighth NFET N18, a fifth PFET P15, and a sixth PFET P16. A pair of the seventh NFET N17 and the fifth PFET P15 and a pair of the eighth NFET N18 and the sixth PFET P16 may respectively form inverting amplifiers (or inverters) between the positive supply voltage AVDD and the negative supply voltage AVSS, and accordingly, the output stage 104 may include cascaded inverting amplifiers to amplify the difference signal DIF.

As shown in FIG. 10, the load information current $I_{LD}$ may be applied to an internal node INT where the difference signal DIF is generated as the load information LD of FIG. 9. Accordingly, when the load information current $I_{LD}$ increases according to an increase in the load current $I_{LOAD}$, the voltage of the internal node INT may increase, and the first detection signal DET1 may be activated, i.e., transitioned to a high level, earlier than when the load information current $I_{LD}$ is not present or is low. Since activation of the first detection signal DET1 indicates that the inductor current $I_L$ reaches the lower bound, an increase in the load information current $I_{LD}$ may cause a increase in the lower bound of the inductor current $I_L$. As a result, the lower bound used by the first current detector 100 may be adjusted by the load information current $I_{LD}$.

Referring to FIG. 11, the lower bound of the inductor current $I_L$ used by the first current detector 100 of FIG. 10 is shown as a lower bound current $I_{LB}$, and as shown in FIG. 11, the lower bound current $I_{LB}$ may increase as the load current $I_{LOAD}$ increases. At each of time t31, time t33, time t35, and time t37, the output voltage $V_{OUT}$ may be less than or equal to a reference voltage $V_{REF}'$, and the switch driver 14 may generate the push signal PS activated in response to the activated comparison signal CMP. In FIG. 11, the reference voltage $V_{REF}'$ may represent a voltage corresponding to the reference voltage $V_{REF}$ of FIG. 1 and comparable to the output voltage $V_{OUT}$. For example, the reference voltage $V_{REF}'$ of FIG. 11 may be defined by the following equation:

$$V'_{REF} = V_{REF}\left(1 + \frac{R11}{R12}\right)$$

Here, the inductor current $I_L$ may increase due to the activated push signal PS, and then the inductor current $I_L$ may decrease due to the deactivated push signal PS and the activated pull signal PL.

At each of time t32, time t34, time t36, and time t38, the inductor current $I_L$ may reach the lower bound current $I_{LB}$, and accordingly, the first current detector 100 may generate the activated first detection signal DET1. The pull signal PL may be deactivated in response to the activated first detection signal DET1. Accordingly, the switch node SW may be floating, but the inductor current $I_L$ may decrease more rapidly due to the diode formed by the second switch SW2. When the inductor current $I_L$ is approximately zero, the output voltage $V_{OUT}$ may start to decrease.

Figure 12:
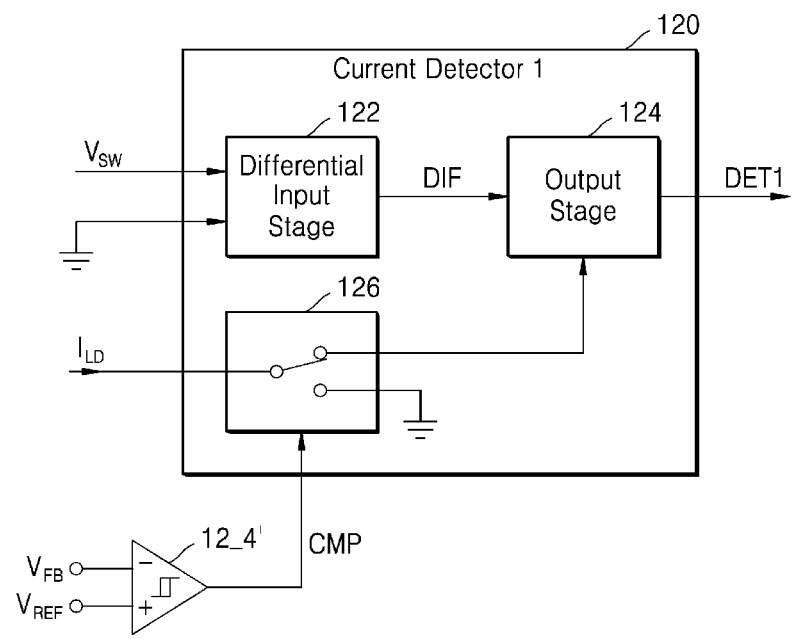
FIG. 12 is a block diagram illustrating an example of a first current detector according to an embodiment.
Figure 13A:
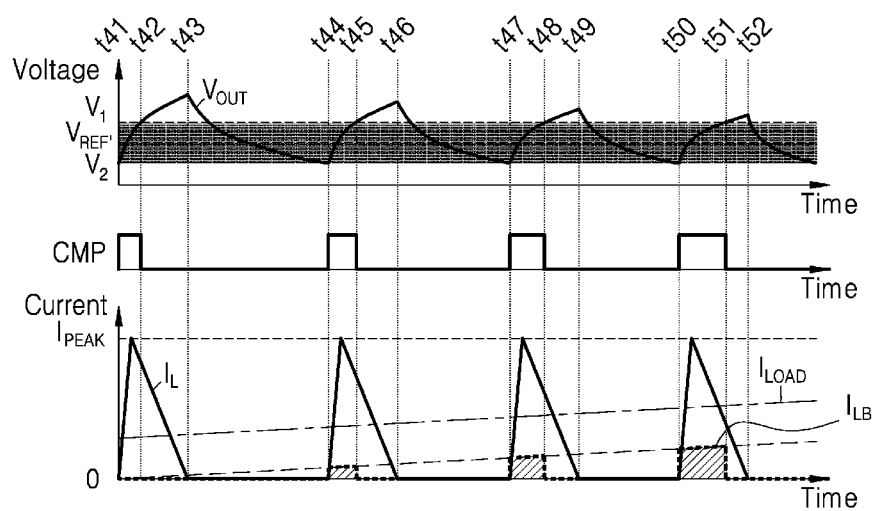
FIGS. 13A and 13B are timing diagrams illustrating examples of an operation of a first current detector according to embodiments.
Figure 13B:
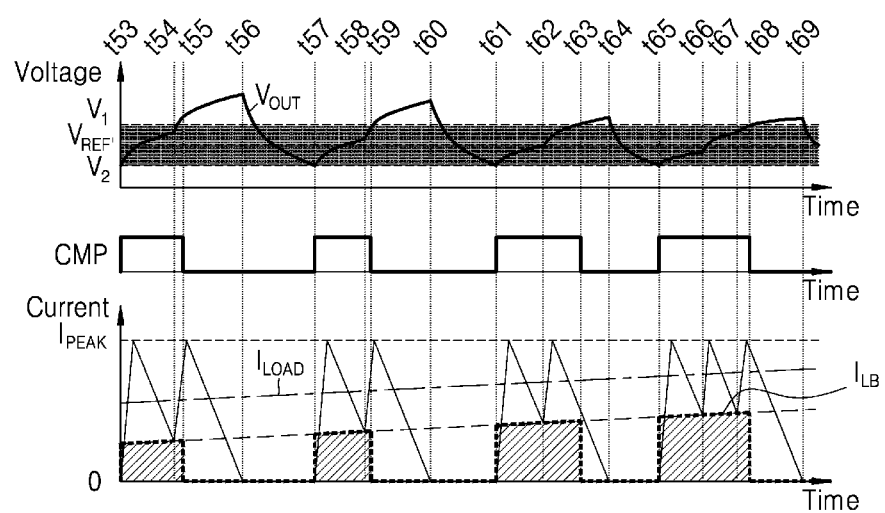

FIG. 12 is a block diagram illustrating an example of a first current detector according to an embodiment, and FIGS. 13A and 13B are respective timing diagrams illustrating examples of operation of the first current detector according to embodiments. The block diagram of FIG. 12 shows the first current detector 120 which sets the lower bound of the inductor current $I_L$ to zero in response to the comparison signal CMP generated by a comparator 12_4'. The timing diagram of FIG. 13A shows the operation of the first current detector 120 when the load current $I_{LOAD}$ increases in a relatively low, and the timing diagram of FIG. 13B shows an example of the operation of the first current detector 120 when the load current $I_{LOAD}$ increases in a relatively high. For the convenience of understanding, a region between the lower bound current $I_{LB}$ and zero is shown shaded in FIGS. 13A and 13B. Hereinafter, FIGS. 12, 13A, and 13B will be described with reference to FIG. 1, and descriptions of FIGS. 12, 13A, and 13B redundant to the descriptions of FIGS. 9, 10 and 11 will be omitted.

Referring to FIG. 12, the first current detector 120 may include a differential input stage 122 and an output stage 124, similarly to the first current detector 90 of FIG. 9, and may further include a switch circuit 126. The differential input stage 122 may generate the difference signal DIF by amplifying a difference between the switch node voltage Vsw and the ground potential. The output stage 124 may generate the first detection signal DET1 in response to a signal provided from the switch signal 126 as well as the difference signal DIF. In some embodiments, the first current detector 120 may further include a resistor coupled between the switch circuit 126 and the ground potential.

The switch circuit 126 may selectively provide the load information current $I_{LD}$ to the output stage 124 as the load information LD in response to the comparison signal CMP provided from the comparator 12_4'. In some embodiments, the comparator 12_4' may have hysteresis, such that a feedback voltage $V_{FB}$ when the comparison signal CMP transitions from an deactivated state to an activated state and the feedback voltage $V_{FB}$ when the comparison signal CMP transitions from the activated state to the deactivated state may have different magnitudes. The hysteresis of the comparator 12_4' may be expressed as a first voltage $V_1$ and a second voltage $V_2$ in FIGS. 13A and 13B, respectively, and the reference voltage $V_{REF}'$ may be between the first voltage $V_1$ and the second voltage $V_2$.

The switch circuit 126 may block the provision of the load information current $I_{LD}$ to the output stage 124 when the feedback voltage $V_{FB}$ is greater than or equal to a predefined magnitude from the reference voltage $V_{REF}$, and thus, the first current detector 120 may detect that the inductor current $I_L$ reaches zero. That is, the lower bound of the inductor current $I_L$ used by the first current detector 120 may be set to zero. Moreover, the switch circuit 126 may provide the load information current $I_{LD}$ to the output stage 124 when the feedback voltage $V_{FB}$ is less than or equal to the predefined magnitude from the reference voltage $V_{REF}$, and thus, the first current detector 120 may detect that the inductor current $I_L$ reaches the lower bound adjusted by the load information current $I_{LD}$. The switch circuit 126 may have any structure that provides or blocks the load information current $I_{LD}$ to or from the output stage 124 according to the comparison signal CMP, and may include at least one transistor controlled by the comparison signal CMP.

Referring to FIG. 13A, at each of time t41, time t44, time t47, and time t50, the output voltage $V_{OUT}$ may be less than or equal to the second voltage $V_2$, and thus the comparison signal CMP may be activated. In addition, the push signal PS may be activated, and the inductor current $I_L$ and the output voltage $V_{OUT}$ may start to increase. Due to the activated comparison signal CMP, the load information current $I_{LD}$ may be provided to the output stage 124, and thus the lower bound current $I_{LB}$ may have the magnitude corresponding to the load current $I_{LOAD}$ and may start to increase due to the rising load current $I_{LOAD}$.

At each of time t42, time t45, time t48, and time t51, the output voltage $V_{OUT}$ may be greater than or equal to the first voltage $V_1$, and thus the comparison signal CMP may be deactivated. Due to the deactivated comparison signal CMP, the load information current $I_{LD}$ may not be provided to the output stage 124, and thus the lower bound current $I_{LB}$ may be set to zero. Further, at each of time t43, time t46, time t49, and time t52, the inductor current $I_L$ may reach the lower bound current $I_{LB}$ set to zero, and thus the pull signal PL may be deactivated, and the output voltage $V_{OUT}$ may start to decrease.

Referring to FIG. 13B, at each of time t53, time t57, time t61, and time t65, the output voltage $V_{OUT}$ may be less than or equal to the second voltage $V_2$, and thus the comparison signal CMP may be activated. In addition, the push signal PS may be activated, and the inductor current $I_L$ and the output voltage $V_{OUT}$ may start to increase. Due to the activated comparison signal CMP, the load information current $I_{LD}$ may be provided to the output stage 124, and thus the lower bound current $I_{LB}$ may have the magnitude corresponding to the load current $I_{LOAD}$ and may start to increase due to the rising load current $I_{LOAD}$.

The switch driver 14 may selectively turn on the first switch SW1 in response to the comparison signal CMP when the inductor current $I_L$ reaches the lower bound current $I_{LB}$. For example, when the inductor current $I_L$ reaches the lower bound current $I_{LB}$ in a state where the comparison signal CMP is deactivated, the switch driver 14 may turn off the second switch SW2 by inactivating the pull signal PL in a state where the push signal PS is deactivated. Accordingly, the inductor current $I_L$ may be maintained at zero (or reduced to zero). Moreover, when the inductor current $I_L$ reaches the lower bound current $I_{LB}$ in a state where the comparison signal CMP is activated, the switch driver 14 may turn off the second switch SW2 and turn on the first switch SW1 by inactivating the pull signal PL and activating the push signal PS. Accordingly, the inductor current $I_L$ may increase again. For example, at each of time t54, time t58, time t62, time t66, and time t67 of FIG. 13B, the inductor current $I_L$ may reach the lower bound current $I_{LB}$ in a state where the comparison signal CMP is activated. The lower bound current $I_{LB}$ may have a magnitude based on the load current $I_{LOAD}$, and thus the inductor current $I_L$ may increase again before reaching zero.

At each of time t55, time t59, time t63, and time t69, the output voltage $V_{OUT}$ may be greater than or equal to the first voltage $V_1$, and thus the comparison signal CMP may be deactivated. Due to the deactivated comparison signal CMP, the load information current $I_{LD}$ may not be provided to the output stage 124, and thus the lower bound current $I_{LB}$ may be set to zero. Further, at each of time t56, time t60, time t64, and time t69, the inductor current $I_L$ may reach the lower bound current $I_{LB}$ set to zero, and thus the pull signal PL may be deactivated and the output voltage $V_{OUT}$ may start to decrease.

Figure 14A:
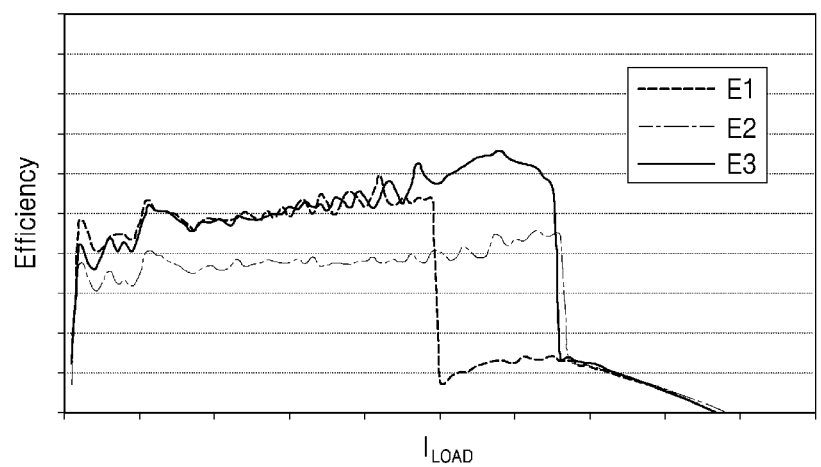
FIGS. 14A and 14B are graphs illustrating the performance of a switching regulator according to embodiments.
Figure 14B:
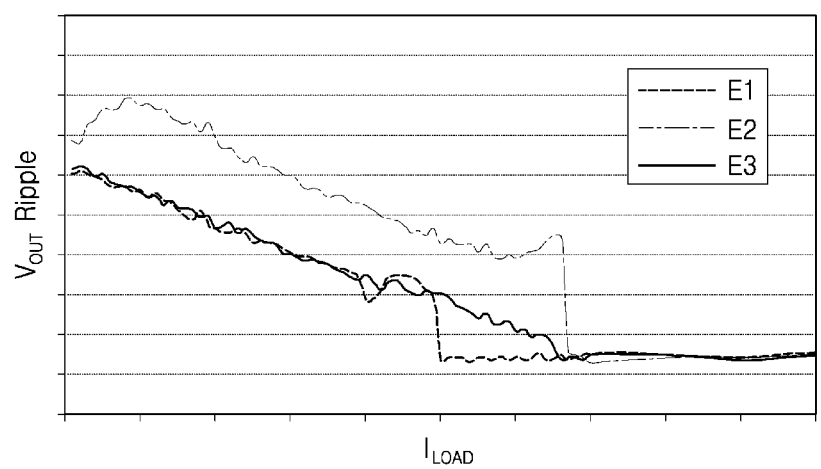

FIGS. 14A and 14B are graphs illustrating the performance of switching regulators according to embodiments. Here, FIG. 14A illustrates efficiencies E1 and E2 of switching regulators according to the comparative examples and an efficiency E3 of the switching regulator according to an embodiment of the inventive concept. FIG. 14B shows ripples E1 and E2 of the output voltage $V_{OUT}$ according to the comparative examples and a ripple E3 of the output voltage $V_{OUT}$ according to an embodiment of the inventive concept. In FIG. 14A and FIG. 14B, the horizontal axis represents the load current $I_{LOAD}$.

Referring to FIG. 14A, in a case E2 where a peak of the inductor current $I_L$ increases as the load current $I_{LOAD}$ increases in the PFM mode, efficiency may be maintained to the load current $I_{LOAD}$ that is relatively high compared to in a case E1 where the peak of the inductor current $I_L$ is maintained, while a low efficiency may be provided even in a range where the load current $I_{LOAD}$ is low. Moreover, in a case E3 where the lower bound of the inductor current $I_L$ is adjusted in response to the load according to an embodiment of the inventive concept, not only the efficiency may be maintained to the relatively high load current $I_{LOAD}$ but also the efficiency may be provided in the entire range of the load current $I_{LOAD}$.

Referring to FIG. 14B, in the case E2 where the peak of the inductor current $I_L$ increases as the load current $I_{LOAD}$ increases in the PFM mode, a ripple of the output voltage $V_{OUT}$ that is remarkably high may occur compared to the case E1 where the peak of the inductor current $I_L$ is maintained. Moreover, in the case E3 where the lower bound of the inductor current $I_L$ is adjusted in response to the load according to an embodiment of the inventive concept, a ripple of the output voltage $V_{OUT}$ having a similar magnitude to that in the case E1 where the peak of the inductor current $I_L$ is maintained may occur. As a result, the switching regulator according to embodiment of the inventive concept may provide high efficiency as well as a reduced ripple of the output voltage $V_{OUT}$.

Figure 15:
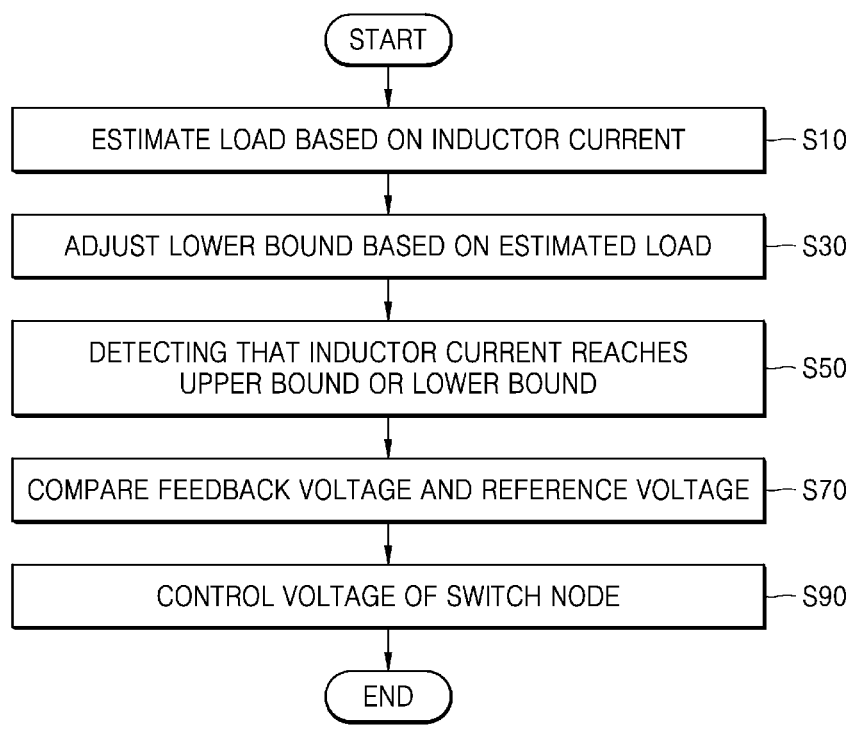
FIGS. 15, 16 and 17 are respective flowcharts variously illustrating a method of converting an input voltage into an output voltage according to an embodiment.

FIG. 15 is a flowchart summarizing a method of converting the input voltage $V_{IN}$ into the output voltage $V_{OUT}$ according to embodiments of the inventive concept. In some embodiments, the method of FIG. 15 may be performed by the switching regulator 10 of FIG. 1 and may be referred to as an operating method for the switching regulator 10. As shown in FIG. 15, the method of converting the input voltage $V_{IN}$ into the output voltage $V_{OUT}$ may include a plurality of steps (or operations) S10, S30, S50, S70, and S90, where at least two steps of the steps S10, S30, S50, S70, and S90 may be performed in parallel with each other. Hereinafter, FIG. 15 will be described with reference to FIG. 1.

An estimate of a load based on the inductor current $I_L$ is made (S10). For example, the load estimator 12_3 may generate the load information LD by estimating the magnitude of the load based on and the upper bound of the inductor current $I_L$ and a period in which the inductor current $I_L$ is greater than or equal to the lower bound. One example of step S10 will be described in some additional detail with reference to FIG. 16.

The lower bound is adjusted based on (or in response to) the estimated load (S30). For example, the first current detector 12_1 detecting that the inductor current $I_L$ reaches the lower bound may adjust the lower bound of the inductor current $I_L$ based on the load information LD provided from the load estimator 12_3. In some embodiments, as described above with reference to FIG. 12, the lower bound of the inductor current $I_L$ may be adjusted in response to the output voltage $V_{OUT}$ as well as the load information LD. One example of step S30 will be described in some additional detail with reference to FIG. 17.

Next, a detection is made when the inductor current $I_L$ reaches the upper bound or the lower bound (S50). For example, the first current detector 12_1 may generate the first detection signal DET1 by detecting that the inductor current $I_L$ reaches the lower bound, and the second current detector 12_2 may generate the second detection signal DET2 by detecting that the inductor current $I_L$ reaches the upper bound.

A comparison of the feedback voltage $V_{FB}$ and the reference voltage $V_{REF}$ may be made (S70). For example, the comparator 12_4 may generate the comparison signal by comparing the feedback voltage $V_{FB}$ generated by dividing the output voltage $V_{OUT}$ to the reference voltage $V_{REF}$. In some embodiments, as described above with reference to FIGS. 12, 13A, and 13B, the comparator 12_4 may have hysteresis.

The switch mode voltage Vsw is controlled (S90). For example, the switch driver 14 may generate the push signal PS and the pull signal PL respectively controlling the first switch SW1 and the second switch SW2 based on the first detection signal DET1 and/or the second detection signal DET2 generated in step S50 and the comparison signal CMP generated in step S70. When the first switch SW1 is turned ON in response to the activated push signal PS, the input voltage $V_{IN}$ may be applied to the switch node SW, and when the second switch SW2 is turned ON in response to the activated pull signal PL, a ground potential may be applied to the switch node SW. In addition, when both the first switch SW1 and the second switch SW2 are turned OFF in response to the deactivated push signal PS and pull signal PL, the switch node SW may be floating. An example of step S90 will be described in some additional detail with reference to FIGS. 18A to 18D.

Figure 16:
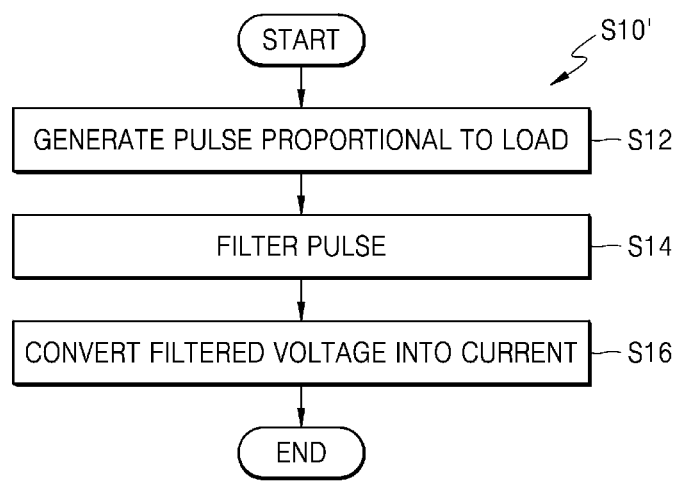

FIG. 16 is a flowchart illustrating an example (10') of step S10 of FIG. 15. Consistent with the description of FIG. 15, the step S10' of FIG. 16 estimates a load based on the inductor current $I_L$. In some embodiments, the method of FIG. 16 may be performed by the load estimator 70 of FIG. 7. As shown in FIG. 16, step S10' may include sub-steps S12, S14, and S16, and in some embodiments, operation S16 may be omitted. Hereinafter, FIG. 16 will be described with reference to FIGS. 1 and 7.

A pulse is generated proportional to the load (S12). For example, the pulse generator 72 may generate the pulse signal PULSE having a magnitude proportional to an upper bound of the inductor current $I_L$ during a period in which the inductor current $I_L$ is greater than or equal to a lower bound. Accordingly, the pulse area of the pulse signal PULSE may be proportional to charges provided to the load by the inductor current $I_L$.

The pulse is then filtered (S14). For example, the pulse generated in step S12 may be passed through the low pass filter 74. Accordingly, the output of the low pass filter 74 may have a magnitude proportional to the pulse area.

Then, the filtered voltage may be converted into a current (S16). For example, a current signal may be required to reflect the estimated load to the lower bound, and thus the voltage-to-current converter 76 may convert the filtered voltage (e.g., the load information voltage $V_{LD}$, may be converted into the load information current $I_{LD}$).

Figure 17:
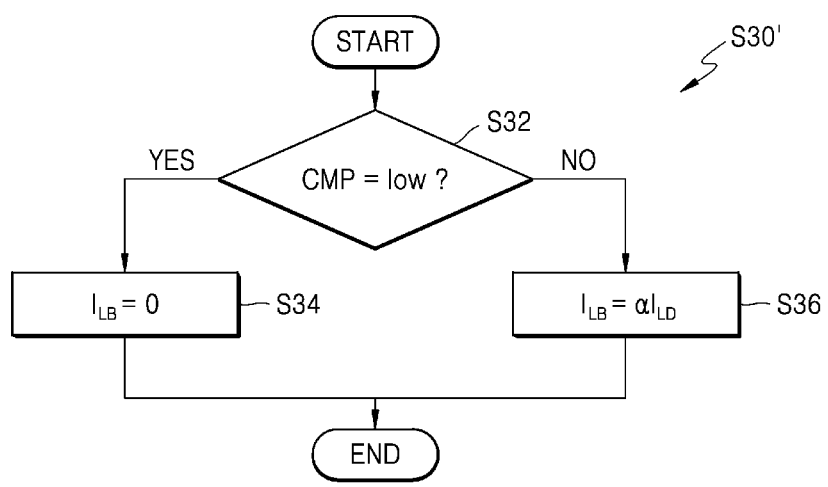

FIG. 17 is a flowchart illustrating an example (30') of step S30 of FIG. 15. Consistent with the description of FIG. 15, in step S30' of FIG. 17 lower bound is adjusted based on an estimated load. In some embodiments, step S30' of FIG. 17 may be performed by the first current detector 120 of FIG. 12. As shown in FIG. 17, step S30' may include a plurality sub-steps S32, S34, and S36. FIG. 17 will be described below with reference to FIGS. 12, 13A, and 13B.

A comparison is made to determining whether the comparison signal CMP is in a deactivated state (S32). For example, the comparison signal CMP may be an active high signal and have a low level when deactivated. As described above with reference to FIGS. 13A and 13B, the comparison signal CMP deactivated due to the hysteresis of the comparator 12_4' may mean that the output voltage $V_{OUT}$ increases to the first voltage $V_1$ or higher and then does not decrease to the second voltage $V_2$ or lower. Accordingly, the deactivated comparison signal CMP may indicate that the output voltage $V_{OUT}$ is relatively well maintained. As shown in FIG. 17, step S34 may subsequently be performed when the comparison signal CMP is deactivated (S32=YES), and step S36 may subsequently be performed when the comparison signal CMP is activated (S32=N0).

In step S34, the lower bound of the inductor current $I_L$ I is set to zero. Accordingly, as described above with reference to FIGS. 13A and 13B, the inductor current $I_L$ may decrease until the inductor current $I_L$ becomes zero. However, in step S36, the lower bound of the inductor current $I_L$ is set to be proportional to the load (e.g., proportional to the load information current $I_{LD}$). Accordingly, as described above with reference to FIG. 13B, the inductor current $I_L$ may increase again before becoming zero.

FIGS. 18A, 18B, 18C and 18D are respective flowcharts illustrating examples of step S90 of FIG. 15. Hereinafter, FIGS. 18A to 18D will be described with reference to FIG. 1.

Figure 18A:
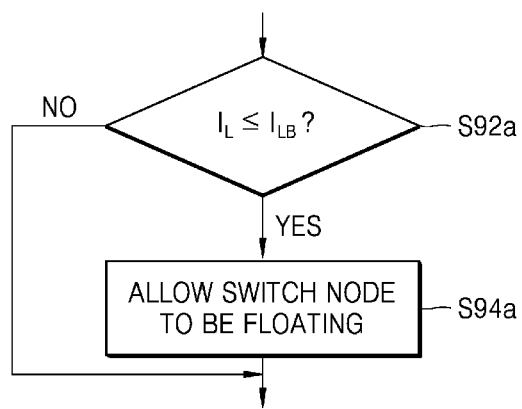
FIGS. 18A, 18B, 18C and 18D are flowcharts illustrating examples of a method of converting an input voltage into an output voltage according to embodiments.

Referring to FIG. 18A, a determination is made as to whether the inductor current $I_L$ reaches the lower bound (S92a). If the inductor current $I_L$ reaches the lower bound (S92a=YES), the switch node SW is allowed to float (S94a). For example, the switch driver 14 may receive the first detection signal DET1, and when the inductor current $I_L$ is less than or equal to the lower bound current $I_{LB}$, may generate the deactivated push signal PS and pull signal PL.

Figure 18B:
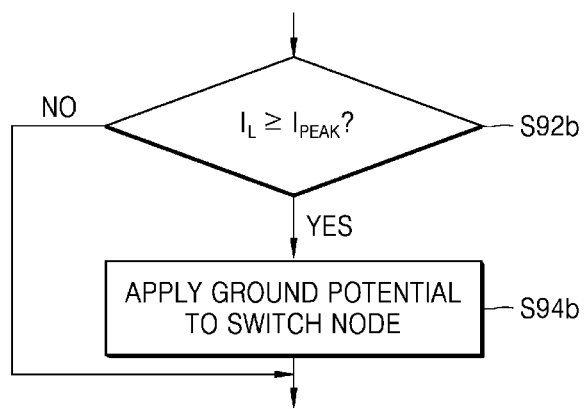

Referring to FIG. 18B, a determination is made as to whether the inductor current $I_L$ reaches the upper bound (S92b). When the inductor current $I_L$ reaches the upper bound t (S92a=YES), the ground potential is applied to the switch node SW (S94b). For example, the switch driver 14 may receive the second detection signal DET2, and when the inductor current $I_L$ is greater than or equal to the peak current $I_{PEAK}$, the deactivated push signal PS and the activated pull signal PL may be generated.

Figure 18C:
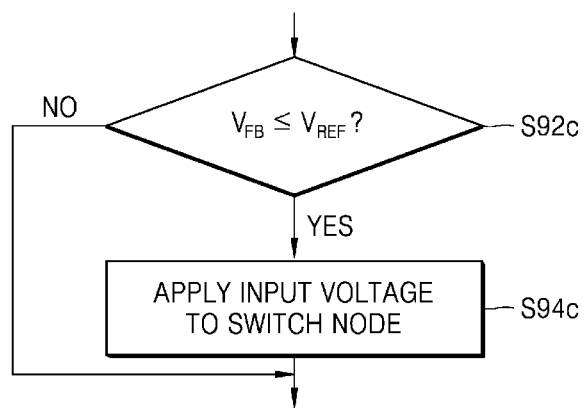

Referring to FIG. 18C, a determination is made as to whether the feedback voltage $V_{FB}$ reaches the reference voltage $V_{REF}$ (S92c). When the feedback voltage $V_{FB}$ reaches the reference voltage $V_{REF}$ (S92c=YES), the input voltage $V_{IN}$ is applied to the switch node SW (S94c). For example, the switch driver 14 may receive the comparison signal CMP and, when the feedback voltage $V_{FB}$ is less than or equal to the reference voltage $V_{REF}$, may generate the activated push signal PS and the deactivated pull signal PL.

Figure 18D:
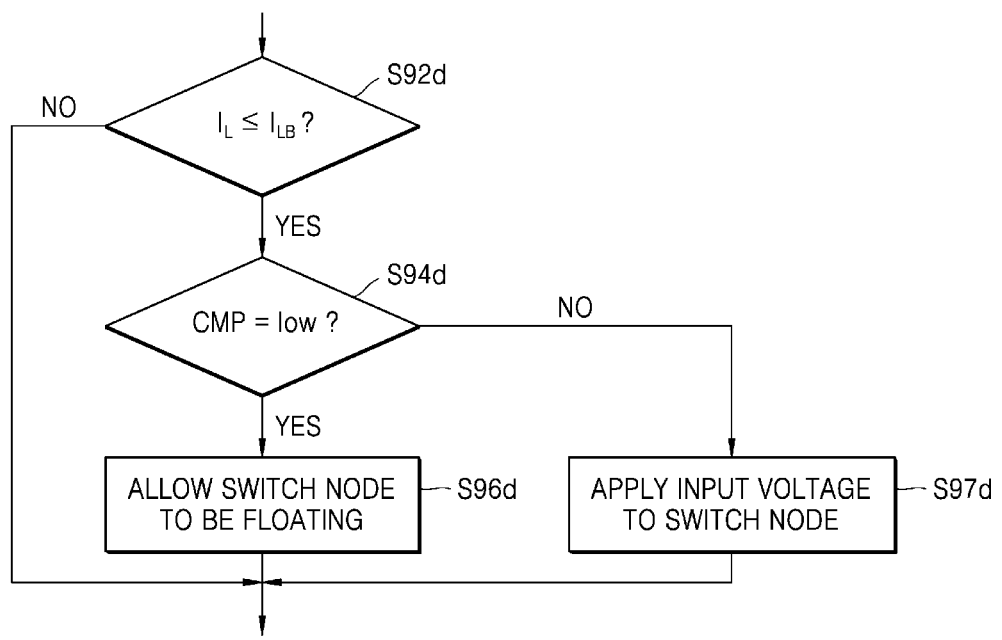

Referring to FIG. 18D, a determination is made as to whether the inductor current $I_L$ reaches the lower bound (S92d). When the inductor current $I_L$ reaches the lower bound (S92d=YES), a further determination is made as to whether the comparison signal CMP is in a deactivated state (S94d). When the comparison signal CMP is deactivated (S94d=YES), the switch node SW is allowed to float, and thus the inductor current $I_L$ may be approximately zero. Else when the comparison signal CMP is activated (S94d=NO), the input voltage is applied to the switch node SW, and thus the inductor current $I_L$ may increase again.

Figure 19:
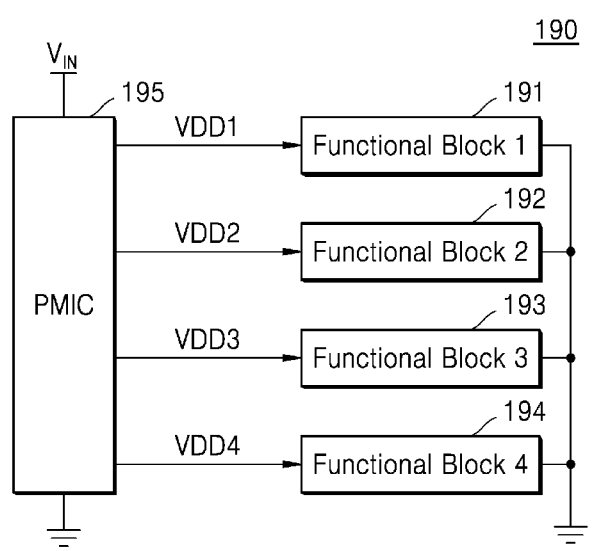
FIG. 19 is a block diagram illustrating a system including a switching regulator according to an embodiment.

FIG. 19 is a block diagram illustrating a system 190 including a switching regulator according to embodiments of the inventive concept. The system 190 may be a single semiconductor integrated circuit (IC), such as a system-on-chip (SoC), or a printed circuit board mounting multiple ICs and related circuitry.

In FIG. 19, the system 190 may include first, second, third and fourth (hereafter, first to fourth) functional blocks 191, 192, 193 and 194, as well as a Power Management Integrated Circuit (PMIC) 195.

The first to fourth functional blocks 191 to 194 may operate in response to power provided by the first to fourth supply voltages VDD1 to VDD4 provided by the PMIC 195. For example, at least one of the first to fourth functional blocks 191 to 194 may be a digital circuit that processes a digital signal, such as an application processor (AP), or may be an analog circuit that processes an analog signal, such as an amplifier. At least one of the first to fourth functional blocks 191 to 194 may also be a circuit that processes a mixed signal such as an analog-to-digital converter (ADC). In some embodiments, the system 190 may include a different number of functional blocks as shown in FIG. 19.

The PMIC 195 may generate first to fourth supply voltages VDD1 to VDD4 from the input voltage $V_{IN}$, and the first to fourth supply voltages VDD1 to VDD4 may have different levels. In some embodiments, the system 190 may be included in a mobile application and input voltage $V_{IN}$ may be provided from a battery. Accordingly, the PMIC 195 may be required to generate the first to fourth supply voltages VDD1 to VDD4 from the input voltage $V_{IN}$ with high efficiency.

In some embodiments, at least one of the first to fourth functional blocks 191 to 194 may have a wide range of power consumption demands. For example, the first functional block 191 may be an image processor that processes image data, may consume high power while processing a video including a series of images, and may consume low power while processing a picture including a single image. In addition, the second functional block 192 may consume high power while performing a function, and enter a low power mode and consume very low power while not in use.

The PMIC 195 may include at least one switching regulator described above with reference to the drawings to generate the first to fourth supply voltages VDD1 to VDD4 from the input voltage $V_{IN}$, such that the PMIC 195 may generate the first to fourth supply voltages VDD1 to VDD4 having desirable characteristics at high efficiency despite variations in the power consumption of the first to fourth functional blocks 191 to 194. Accordingly, the performance and efficiency of the system 190 may be improved, and as a result, the performance and efficiency of an application including the system 190 may be improved.

While the inventive concept has been particularly shown and described with reference to embodiments thereof, it will be understood that various changes in form and details may be made therein without departing from the spirit and scope of the following claims.

What is claimed is:

1. A switching regulator that generates an output voltage from an input voltage, the switching regulator comprising:
   an inductor including a first terminal and a second terminal, wherein the inductor passes an inductor current from the first terminal to the second terminal;
   a first switch that applies the input voltage to the first terminal when turned ON;
   a second switch that applies a ground potential to the first terminal when turned ON;
   a load estimator that estimates a load receiving the output voltage and provides load information corresponding to the load;
   a first current detector that generates a first detection signal in response to detecting the inductor current reaches a lower bound, the lower bound being adjusted based on the load information; and
   a switch driver configured to turn OFF the second switch in response to the first detection signal indicating the inductor current reaches the lower bound.

2. The switching regulator of claim 1 wherein the load estimator estimates the load based on a period in which the inductor current is equal to or greater than the lower bound.

3. The switching regulator of claim 2, further comprising:
   a second current detector that generates a second detection signal in response to detecting the inductor current reaches an upper bound of the inductor current, wherein
   the load estimator further estimates the load in response to the upper bound.

4. The switching regulator of claim 3, wherein the load estimator comprises:
   a pulse generator that generates a pulse having a magnitude proportional to the upper bound; and
   a low pass filter that filters the pulse.

5. The switching regulator of claim 4, wherein the load estimator further comprises a voltage-current converter that generates the load information by converting an output of the low pass filter into a current signal.

6. The switching regulator of claim 5, wherein the first current detector comprises:
   a differential input stage that receives a voltage apparent at the first terminal and the ground potential; and
   an output stage that receives an output of the differential input stage and the load information and generates the first detection signal.

7. The switching regulator of claim 3, wherein the switch driver is further configured to turn OFF the first switch and turn ON the second switch in response to the second detection signal indicating the inductor current reaches the upper bound.

8. The switching regulator of claim 1, further comprising:
   a comparator that generates a comparison signal based on a comparison of a reference voltage and a feedback voltage generated from the output voltage, wherein
   the switch driver is further configured to turn ON the first switch when the feedback voltage is less than the reference voltage.

9. The switching regulator of claim 8, wherein:
   the comparator has hysteresis, and
   the switch driver is further configured to selectively turn ON the first switch in response to the comparison signal indicating the inductor current reaches the lower bound.

10. The switching regulator of claim 9, wherein the first current detector selectively adjusts the lower bound to zero in response to the comparison signal.

11. The switching regulator of claim 1, further comprising:
    a capacitor coupled to the second terminal, wherein the output voltage is generated in the second terminal.

12. A switching regulator that generates an output voltage from an input voltage, the switching regulator comprising:
    an inductor, including a first terminal and a second terminal, that passes an inductor current from the first terminal to the second terminal;
    a first switch that applies the input voltage to the first terminal when turned ON;
    a second switch that applies a ground potential to the first terminal when turned ON;
    a feedback circuit configured to estimate a load receiving the output voltage, detect when the inductor current reaches an upper bound or a lower bound, and adjust the lower bound based on the estimated load; and
    a switch driver configured to control the first switch and the second switch, in response to at least one feedback signal provided by the feedback circuit, such that the inductor current is maintained between the upper bound and the lower bound.

13. The switching regulator of claim 12, wherein the feedback circuit comprises a load estimator configured to estimate the load based on the inductor current, the upper bound, and the lower bound.

14. The switching regulator of claim 12, wherein:
    the feedback circuit comprises a first current detector that generates a first detection signal in response to detecting the inductor current reaches the lower bound, and
    the switch driver is configured to turn OFF the second switch in response to the first detection signal indicating the inductor current reaches the lower bound.

15. The switching regulator of claim 12, wherein:
    the feedback circuit further comprises a second current detector that generates a second detection signal in response to detecting the inductor current reaches the upper bound, and
    the switch driver is further configured to turn OFF the first switch and turn ON the second switch in response to the second detection signal indicating the inductor current reaches the upper bound.

16. The switching regulator of claim 12, wherein:
    the feedback circuit comprises a comparator that compares a reference voltage with a feedback voltage generated from the output voltage, and
    the switch driver is further configured to turn ON the first switch when the feedback voltage is less than the reference voltage.

17. A method of converting an input voltage to an output voltage, the method comprising:
    detecting that generates a detection result in response to detecting an inductor current passing from a first terminal of an inductor to a second terminal of the inductor reaches an upper bound or a lower bound;
    controlling a voltage apparent at the first terminal in response to the detection result by at least one of:
    applying the input voltage to the first terminal;
    applying a ground potential to the first terminals; and
    allowing the first terminal to float;
    estimating a load in response to the inductor current; and
    adjusting the lower bound based on the estimated load.

18. The method of claim 17, wherein the estimating of the load comprises:
    generating a pulse having a magnitude proportional to the upper bound during a period in which the inductor current is equal to or greater than the lower bound; and
    passing the pulse through a low pass filter.

19. The method of claim 17, further comprising:

comparing a reference voltage to a feedback voltage generated from the output voltage, wherein the controlling of the voltage of the first terminal comprises applying the input voltage to the first terminal when the feedback voltage is less than the reference voltage.

20. The method of claim 19, wherein the adjusting of the lower bound comprises setting the lower bound to zero when the feedback voltage exceeds a predefined magnitude from the reference voltage.

* * * * *